United States Patent [19]

Blair et al.

[11] 4,341,107

[45] Jul. 27, 1982

[54] CALIBRATABLE SYSTEM FOR MEASURING FLUID FLOW

[75] Inventors: Richard F. Blair, Fountain Valley; Ralph Beazley, Rancho Palos Verdes, both of Calif.

[73] Assignee: Tylan Corporation, Carson, Calif.

[21] Appl. No.: 196,410

[22] Filed: Oct. 14, 1980

[51] Int. Cl.³ .................... G01F 1/74; G01F 25/00
[52] U.S. Cl. ............................ 73/3; 137/101.19; 73/195; 73/861.04
[58] Field of Search ............. 73/195, 196, 861.04, 73/3; 137/101.19

[56] References Cited

U.S. PATENT DOCUMENTS

| | | |
|---|---|---|
| 2,290,408 | 7/1942 | Crites ........................... 73/195 |
| 2,328,499 | 8/1943 | Saathoff . | |
| 2,946,220 | 7/1960 | Cogniat et al. .............. 73/196 |
| 3,650,151 | 3/1972 | Drexel ...................... 73/861.04 |
| 3,762,428 | 10/1973 | Beck . | |
| 3,963,043 | 6/1976 | Cota . | |
| 4,083,243 | 4/1978 | Cochram ..................... 73/195 |
| 4,090,179 | 5/1978 | Hirano . | |
| 4,091,056 | 5/1978 | Hamalainen et al. ......... 73/861.04 |
| 4,198,860 | 4/1980 | King .......................... 73/195 |

*Primary Examiner*—Herbert Goldstein
*Attorney, Agent, or Firm*—Nilsson, Robbins, Dalgarn, Berliner, Carson & Wurst

[57] ABSTRACT

A pair of mass flow sensors are used to separately monitor the mass flow rates of a carrier gas and of a mixture of carrier gas and source vapor formed a mixing station. The rates are compared, for example by substracting the carrier gas flow rate from the mixture flow rate, to generate a signal representing the mass flow rate of the source vapor. Flow of the carrier gas to the mixing station is modulated in accordance with the difference between this signal and a command signal representing a predetermined flow rate. The system can be calibrated by flowing the carrier gas alone through both sensors, by passing the mixing station, and adjusting the signal for one or both sensors so that the signals from both sensors are equalized.

6 Claims, 5 Drawing Figures

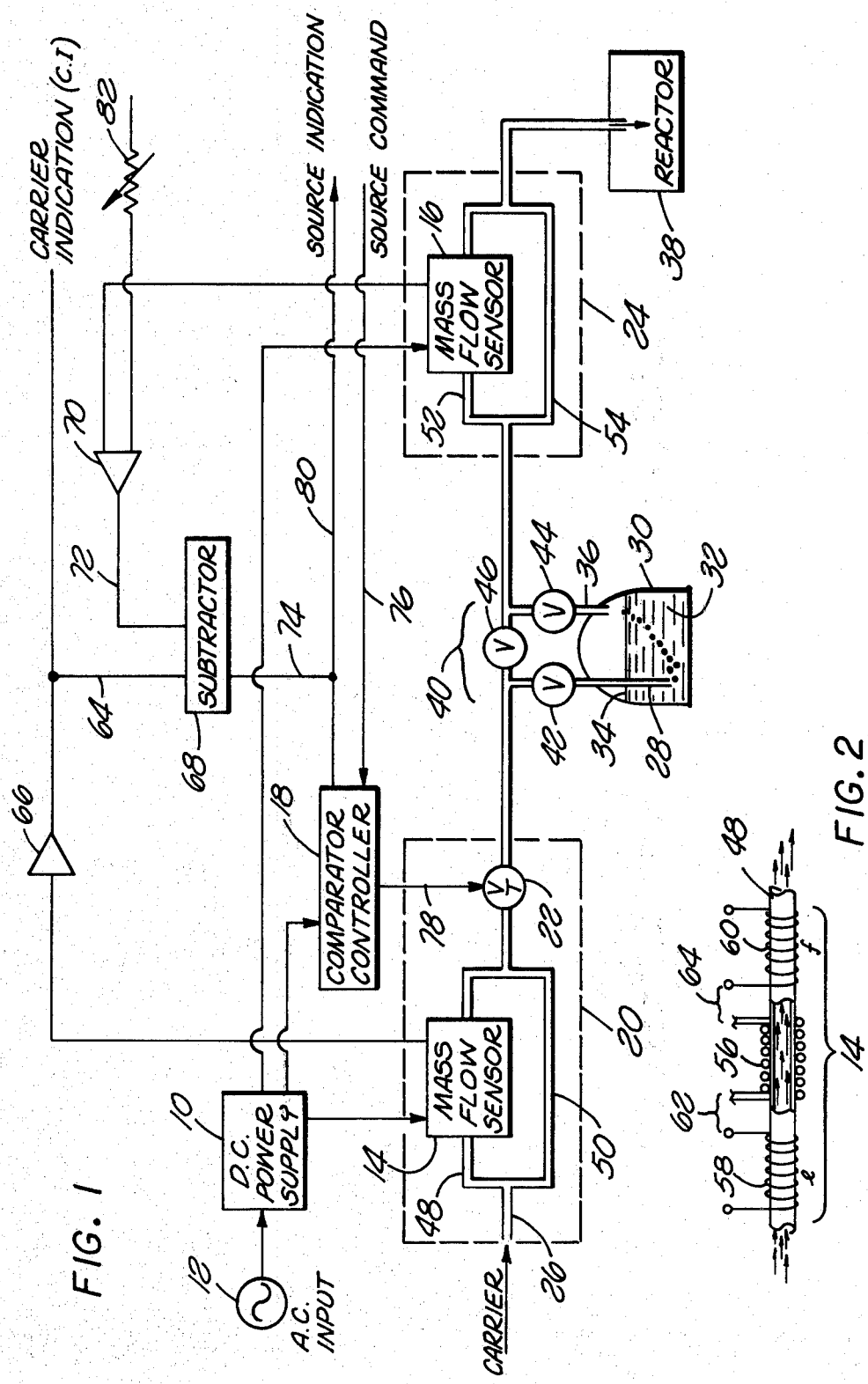

CALIBRATABLE SYSTEM FOR MEASURING FLUID FLOW

FIELD OF THE INVENTION

The field of art to which the invention pertains includes the field of mass flow measurement.

BACKGROUND AND SUMMARY OF THE INVENTION

In many vapor-phase chemical processes, it is necessary to precisely meter the flow rate of chemicals as vapor-phase constituents of a flowing gas medium. For example, in the fabrication of semiconductors, hydrogen or nitrogen as a carrier gas can be bubbled through a liquid vapor source such as silicon tetrachloride to pick up vapors of the silicon tetrachloride and carry the vapors into a reaction chamber. In the reaction chamber, a portion of the silicon tetrachloride can be made to pyrophorically react to form a pure silicon deposit in the form of an epitaxial layer on a semiconductor wafer. Since the rate of deposition is related to the amount of silicon tetrachloride present in the reaction chamber, one must accurately control the amount of silicon tetrachloride picked up by the carrier gas. It is also desirable to know the absolute flow rate of the silicon tetrachloride so that the results may be correlated and, in some applications, so that the entire process can be automated.

Regulation of vapor mass flow rate is accomplished by utilizing one of several techniques. One method meters the source liquid to a flash vaporizer but is not practical for extremely small flow rates, particularly of corrosive chemicals because of the lack of metering precision and the effects of contamination. In another method, carrier gas is conducted through a bubbler to pick up vaporized source liquid. The rate of source vapor pick-up is controlled by simultaneously regulating parameters such as the pressure, temperature and volume flow rate of the carrier gas, the temperature and pressure of the source liquid in the bubbler, and the temperature of the various plumbing lines to the extent that conditions are regulated and the degree of saturation of vapor and carrier is constant. This method often has inadequate sensitivity for some combinations and does not give an indication of absolute mass flow rate but requires judgments to be made on a trial-and-error basis with performance judged by testing the product after deposition is completed.

Another, more recent method uses a bubbler and a combination of thermal conductivity cells and mass flow sensors. The ratio of source vapor flow rate to carrier flow rate is measured by thermal conductivity analysis of the carrier gas as it enters the bubbler and of the mixture as it emerges from the bubbler. The mass flow of the carrier gas is also measured prior to entering the bubbler. The flow rate of the carrier gas and the above ratio are electronically multiplied to yield the rate of flow of the source vapor. Details of this method are disclosed in C.F. Drexel U.S. Pat. No. 3,650,151. The method overcomes drawbacks of the other methods and permits the absolute mass flow rate of a fluid to be controlled and monitored regardless of changes in pressures, temperatures, levels or other variables. However, the method is limited by the accuracy of the thermal conductivity measurement. Additionally, because the thermal conductivity cells are heated, the vapor is exposed to the possibility of contamination from the cells themselves. Also, long term build-up of vapor material on the walls of the thermal conductivity cells can result in subtle changes in volume of the cells, requiring periodic recalibration. Such recalibration involves the use of standarized mixtures and is thus not only time consuming but expensive.

The present invention provides a system for accurately monitoring and controlling the absolute mass flow rate of a fluid in a fashion similar to the Drexel method, that is regardless of changes in pressures, temperatures, levels or any other variables, but which eliminates the complexity and inaccuracy associated with thermal conductivity cells. Additionally, it provides a means for rapid self-calibration, which is accomplished with such a degree of ease that the system can be recalibrated before every run, thereby greatly enhancing the reliability of the system. In accordance with the present invention, a pair of mass flow sensors are used to monitor the mass flow rates of a carrier gas and of a mixture of the carrier gas and a source vapor formed at a mixing station. The rates are compared, for example, by electronically subtracting the carrier gas flow rate from the mixture flow rate, to generate a signal representing the mass flow rate of the source vapor. The flow of the carrier gas to the mixing station is modulated in accordance with the difference between this signal and a command signal representing a predetermined flow rate. As a result of the modulation, accomplished by appropriately throttling the valve in the carrier gas line, as changes in temperature or pressure vary the pick-up rate, i.e., the concentration, of the source vapor, the system automatically readjusts the carrier flow to maintain the vapor flow rate at the desired level.

More specifically, a control system is provided for accurately metering the amount of a predetermined liquid vaporized by a carrier gas and includes a mixing station, a flow controller, a flowmeter and various signal comparing and generating means. The mixing station can be a bubbler as known to the art or any mechanism for mixing carrier gas with vaporized liquid. The flow controller comprises an inlet for carrier gas, and an outlet, a mass flow sensor connected between the inlet and outlet which serves to generate a signal in correspondence to the flow rate of the carrier gas through the sensor, and an adjustable value which controls flow through the outlet to deliver carrier gas to the mixing station. The flowmeter comprises an inlet for receiving the mixture from the mixing station, and an outlet therefor, and a second mass flow sensor connected between the flowmeter inlet and outlet which serves to generate a signal in correspondence to the mass flow rate of the mixture. An electronic signal from the flow controller mass flow sensor is compared to an electronic signal from the flowmeter mass flow sensor, e.g. by subtracting the first signal from the second signal, to yield a third signal representing the mass flow of the vaporized liquid. A command signal generated in accordance with a predetermined mass flow rate of vaporized liquid is compared to the third signal and any difference therebetween is used to adjust the flow controller valve so as to minimize or eliminate any such difference.

Since the vapors used in semiconductor chemical processes are generally of a contaminating nature, any component exposed to the vapor is prone to develop contamination build-up which adversely affects the calibration accuracy over a long period of time. A significant advantage of the present invention is that calibration can be verified and readjusted as necessary prior to each process run without removal of components from the system and without requiring special calibration equipment to assure repeatable results. Specifically, the carrier gas is diverted from the outlet of the flow controller to the inlet of the flowmeter, bypassng the mixing station. Accordingly, in a calibration step, only carrier gas flows through the flowmeter mass flow sensor. Therefore, the output of the flowmeter mass flow sensor can be electronically adjusted to precisely match the output of the flow controller mass flow sensor giving a resultant source indication of zero. This capability significantly lengthens the service life over other types of instruments used in this type of application. Furthermore, almost any gas can be used as the carrier for almost any chemical vapor. This allows for many new carrier/chemical combinations that could not previously be handled by a thermal conductivity cell instrument, for example, due to inadequate sensitivity.

BRIEF DESCRIPTION OF THE DRAWINGS

FIG. 1 is a block diagram of the operation of the control system of the present invention;

FIG. 2 is a detailed, schematic view of a mass flow sensor which can be utilized in a control system of the present invention.

DETAILED DESCRIPTION

Figure 3:
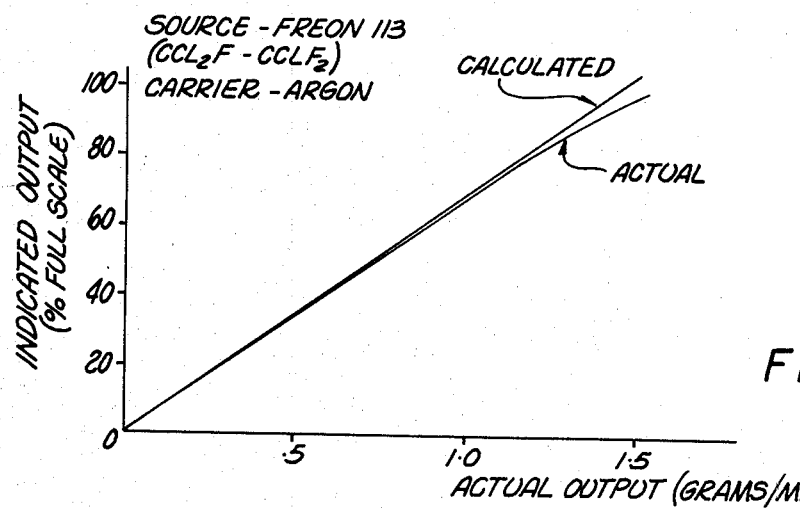
FIGS. 3–5 are graphs depicting calculated and actual source indications, on the ordinate versus source/carrier ratios, on the abscissa for various flow rates of dichlorodifluoromethane as the source and nitrogen as the carrier gas.

As required, a detailed illustrative embodiment of the invention is disclosed herein. However, it is to be understood that this embodiment merely exemplifies the invention which may take forms different from the specific illustrative embodiment disclosed. For example, a calibration step is described as involving an adjustment of the signal from the flowmeter mass flow sensor so that the signals from both mass flow sensors are equalized, whereas one could adjust either the other sensor or both. Also, while the system is illustrated with respect to vaporization of a liquid with gas, the control system could also be used to mix only gases, for example, by utilizing desired signals to control a jet pump or atomizer. Similarly, one could use a system with a sublimating solid by controlling the flow rate of carrier gas to the solid. Furthermore, the measurement aspects of the present invention can be utilized separately and independently of control mechanisms. Other modifications may be evident upon reading the following specification.

Referring to FIG. 1, the system includes a DC power supply 10 energized via a transformer by an AC input source 12 and which feeds power to a pair of mass flow sensors 14 and 16 and a comparator controller 18, the purpose and function of which will be described in more detail hereinafter.

One of the mass flow sensors 14 is a component of a flow controller, indicated in shadow at 20 which includes as another component an adjustable throttling valve 22. The other mass flow sensor 16 is a component of a flowmeter, indicated in shadow at 24. Tubing 26 is utilized to convey carrier gas through the flow controller mass flow sensor 14 and via the throttling valve 22 to the input tubing 28 of a bubbler, i.e., a vaporizing-type tank or source vaporizer 30 of diluent 32 such as liquid silicon tetrachloride. The carrier gas, such as hydrogen, bubbles through the diluent 32, picking up vaporized liquid and carrying it into the upper end of the tank 30 above the liquid level 34 where it passes into outlet tubing 36. The outlet tubing 36 carries the mixture of carrier gas and vaporized liquid to the flowmeter mass flow sensor 16 and from there into a pyrophoric reactor 38, as known to the art, to deposit pure silicon on semiconductor wafers, or the like.

A by-pass valve mechanism 40 is provided for diverting carrier gas from the throttling valve 22 to the flowmeter mass flow sensor 16, bypassing the vaporizing tank 30. The valve mechanism 40 can be constructed of a single valve housing with appropriate shunts or it can be constructed as shown of three open-shut valves, a valve 42 to the input tubing 28, a valve 44 from the output tube 36 and a shunt valve 46 therebetween. When the shunt valve 46 is closed and the input and output valves 42 and 44 are open, the carrier gas is directed into the vaporizing tank 30. When the shunt valve 46 is open and the input and output valves 42 and 44 closed, the carrier gas is diverted so as to travel directly from the flow controller 20 to the flowmeter 24. The carrier gas is diverted in such manner for calibration purposes, as will be described in more detail hereinafter.

Referring more particularly to flow of the carrier gas and vaporized source liquid through the system, initially, the carrier gas is conducted through a sampling tube 48 of the mass flow sensor 14, in parallel with a by-pass tube 50 and from there is conducted through the throttling valve 22, through the input line 28 to the vaporizing tank 30 and out through the output tube 36 carrying vaporized source liquid, as hereinbefore indicated. The mixture of carrier gas and vaporized source liquid is then conducted through a sampling tube 52 to the flowmeter mass flow sensor 16, in parallel with a flow meter by-pass tube 54, and from there to the reactor 38.

Referring additionally to FIG. 2, the flow controller mass flow sensor 14 is depicted, the flowmeter mass flow sensor 16 being of identical construction. The mass flow sensor 14 is defined by a heater element 56, wound on the sampling tube 48, and a pair of resistance thermometer elements 58 and 60, also wound on the sampling tube 48 and spaced equidistant from the heater element 56, as indicated at 62 and 64. The resistance elements 58 and 60 are connected to resistors as bridge circuit components which are part of a signal conditioner that electronically provides a linear output voltage as a function of mass flow. Means of accomplishing this circuitry are well known, for example, as illustrated in FIG. 3 of Drexel U.S. Pat. No. 3,650,151. The linear output voltage is applied through an amplifier 66 and, as indicated by the line 64, is applied to a subtractor 68, defined by logic circuitry which serves to determine the difference in signals applied thereto. Alternatively, one could use two elements with self-heating means as shown in LeMay U.S. Pat. No. 4,056,975.

In similar manner, the flowmeter mass flow sensor 16 serves to generate a linear output voltage as a function of mass flow of the carrier gas and source vapor through the sampling tube 52. The voltage from the flowmeter mass flow sensor 16 is applied through an amplifier 70 and, as indicated by the line 72, is then applied to the remaining terminal of the subtractor 68.

At the subtractor 68, the output of the flow controller mass flow sensor 14 is electronically subtracted from the output of the flowmeter mass flow sensor 16. As will be discussed hereinafter in more detail, the outputs of the mass flow sensors 14 and 16 are substantially linear with the actual mass flow rate over a wide range of source-to-carrier concentration. Therefore, the result of the electronic substraction at the subtractor 68 is a signal voltage which corresponds to the absolute value of mass flow rate of the vaporized source liquid 32. This signal voltage is applied as indicated by the line 74 to the comparator controller 18 where it is compared to a command signal as indicated by the line 76 which is set at a desired value. The differential between the command signal voltage and the subtractor signal voltage, if any, is amplified and applied over the line 78 to power an actuator for the throttle valve 22. The throttle valve 22 is thus controlled so that it opens more when the comparator controller 18 indicates that the mass flow rate of vaporized source liquid is insufficient to balance the command signal, and is closed more when the opposite situation occurs. Accordingly, a closed loop control circuitry is provided yielding stabilizing feedback. Additionally, the signal voltage obtained from the subtractor 68 is conveyed by a line 80 to indicating equipment, such as a strip chart, to indicate and/or keep a record of the mass flow rate of vaporized source liquid.

As above indicated, a major advantage of the present invention is the ability to rapidly and easily calibrate the instrumentation. By flowing only carrier gas through both the flow controller mass flow sensor 14 and flowmeter mass flow sensor 16, the output of the flowmeter mass flow sensor 16 can be electronically adjusted to precisely match that of the flow controller mass flow sensor 14. For example, a variable resistance 82 in the amplifier 70 circuit can be appropriately adjusted in accordance with common techniques, giving a resultant source indication of zero. This feature significantly lengthens the service life of instruments used in this application.

In summary of operation, as an exemplifying operation, carrier gas such as hydrogen is fed through the tubing 26, enters through the flow controller 20 where a portion of the carrier gas is passed through the flow controller mass flow sensor 14, and from there, the carrier gas passes through the throttling valve 22 into the vaporizing tank 30. From there, the carrier gas picks up vaporized source liquid and is carried through the flowmeter 24, a portion of the mixture being passed through the flowmeter mass flow sensor 16, whereupon the mixture of carrier gas and vaporized source liquid is applied to the pyrophoric reactor 38. Signal voltages from the mass flow sensors 14 and 16 are applied to the subtractor 68 where they yield a control signal which is representative of the absolute value of the mass flow rate of the vaporized source liquid 32 and which is applied to the comparator controller 18 for modulation of the throttle valve 22. The result is the accurate and automatic monitoring and modulation of the flow rate of the vaporized source liquid 32 in accordance with a predetermined standard, without need for monitoring or regulating the carrier gas pressure or temperature, temperature of the plumbing or level or temperature of the diluent fluid. When it is desired to calibrate the system, which can be before any run, the valves 42 or 44 are closed off and the valve 46 is opened so that carrier gas flows directly from the flow controller 20 into the flowmeter 24. The amplified signal from the flowmeter mass flow sensor 16 can then be adjusted by means of the variable resistance 82 to match that of the signal from the flow controller mass flow sensor amplifier 66. Alternatively, one can modify the flow controller mass flow sensor amplifier 66 to achieve a similar result or one can modify both amplifiers 66 and 70.

As above mentioned, operation of the invention over a wide range of conditions and varying pick-up rates requires that both the vaporized source liquid indication and carrier gas indication be accurate and substantially linear with the actual variables over a wide range of concentrations. State-of-the-art mass flow meters exhibit better than 1% absolute accuracy and linearity. However, since the output of such instruments is proportional to the molar specific heat (product of density and specific heat at constant pressure) one can question whether or not a signal derived from measuring the mass flow rate of the mixture of carrier gas and vaporized source liquid, minus the signal derived from measuring the mass flow rate of only the carrier gas results in a linear vaporized source liquid signal. The applicable equations are as follows:

$$\text{carrier indication} = K_1 \cdot (C/F_c)$$

$$\text{mixture indication} = K_1 \cdot \frac{C+S}{F_m}$$

$$\text{source indication} = K_1 \cdot \frac{C+S}{F_m} - K_1 \frac{C}{F_c}$$

in which the factors have the following values:

$$F_c = K_2 \cdot \frac{N_c}{P_c C_{pc}}$$

$$F_s = K_2 \cdot \frac{N_s}{P_s C_{ps}}$$

$$F_m = K_2 \cdot \frac{\frac{C}{C+S} N_c + \frac{S}{C+S} \cdot N_s}{\frac{C}{C+S} P_c C_{pc} + \frac{S}{C+S} P_s C_{ps}}$$

where $F_x$ is a flow factor related to gas properties and where $K_1$ and $K_2$ are scaling constants, C is the carrier mass flow rate, S is the vaporized source liquid mass flow rate, $P_c$ and $P_s$ are the densities of the carrier and source, respectively, $C_{pc}$ and $C_{ps}$ are the specific heats of the carrier and source, respectively, and $N_c$ and $N_s$ are constants which depend upon the molecular structure of the gas, for the carrier and source, respectively, and varies from 0.88 for polyatomic gases to 1.04 for monotomic gases.

Neglecting all scaling constants, the equations are:

$$F_m = \frac{CN_c + SN_s}{CP_c C_{pc} + SP_s C_{ps}} = \frac{1 + \frac{S}{C} \frac{N_s}{N_c}}{\frac{P_c C_{pc}}{N_c} + \frac{S}{C} \frac{P_s C_{ps}}{N_c}} =$$

$$\frac{1 + \frac{S}{C} \frac{N_s}{N_c}}{\frac{1}{F_c} + \frac{S}{C} \frac{N_s}{N_c} \cdot \frac{1}{F_s}}$$

$$\text{Source indication} = (C + S) \frac{\frac{1}{F_c} + \frac{S}{C} \frac{N_s}{N_c} \frac{1}{F_s}}{1 + \frac{S}{C} \frac{N_s}{N_c}} - \frac{C}{F_c} =$$

$$\frac{\mathcal{C} + S\frac{N_s}{N_c} \frac{F_c}{F_s} + S + \frac{S^2}{C} N_s F_c - \mathcal{C} - S\frac{N_s}{N_c}}{\left(1 + \frac{S}{C} \frac{N_s}{N_c}\right) F_c}$$

$$= S \frac{1 + \frac{N_s}{N_c} \frac{F_c}{F_s} + \frac{S}{C} \frac{N_s}{N_c} \frac{F_c}{F_s} - \frac{N_s}{N_c}}{F_c\left(1 + \frac{S}{C} \frac{N_s}{N_c}\right)} =$$

$$S \frac{1 + \frac{N_s}{N_c}\left(\frac{S}{C} \frac{F_c}{F_s} + \frac{F_c}{F_s} - 1\right)}{F_c\left(1 + \frac{S}{C} \frac{N_s}{N_c}\right)} +$$

$$S \frac{1 + \frac{N_s}{N_c} \frac{F_c}{F_s}\left(1 + \frac{S}{C}\right) - \frac{N_s}{N_c}}{F_c\left(1 + \frac{S}{C} \frac{N_s}{N_c}\right)} =$$

$$S \frac{1 + \frac{P_s C_{ps}}{P_c C_{pc}}\left(1 + \frac{S}{C}\right) - \frac{N_s}{N_c}}{F_c\left(1 + \frac{S}{C} \frac{N_s}{N_c}\right)}$$

Note that if the constant $N_s$ equals $N_c$, which would be the case with a common molecular structure, the last expression reduces to:

Source indication $= S/F_s$

Carrier gases that can be used include, but are not limited to, nitrogen, hydrogen, oxygen, helium and argon. Liquid chemicals that can be vaporized herein include, but are not limited to, germanium tetrachloride, silica tetrachloride, trichlorosilane, boron tribromide and phosphyoxychloride. Assuming carrier gases of nitrogen, hydrogen and oxygen with liquid chemicals of germanium tetrachloride (GeCl$_4$) at 0-12% S/C, silicon tetrachloride (SiCl$_4$) at 0-100% S/C, and trichlorosilane (SiHCl$_3$) at 0-200% S/C, the above equation was used to examine vaporized source liquid indications versus actual vaporized source liquid flow. For all combinations it was found that a maximum non-linearity of ±0.7% resulted. This non-linearity can be easily compensated for in the electronic design of the subtractor 68.

Figure 4:
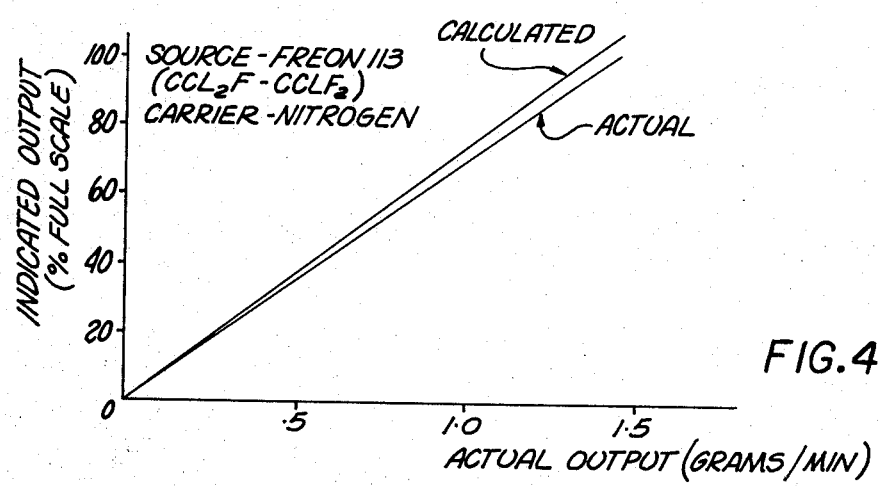
Figure 5:
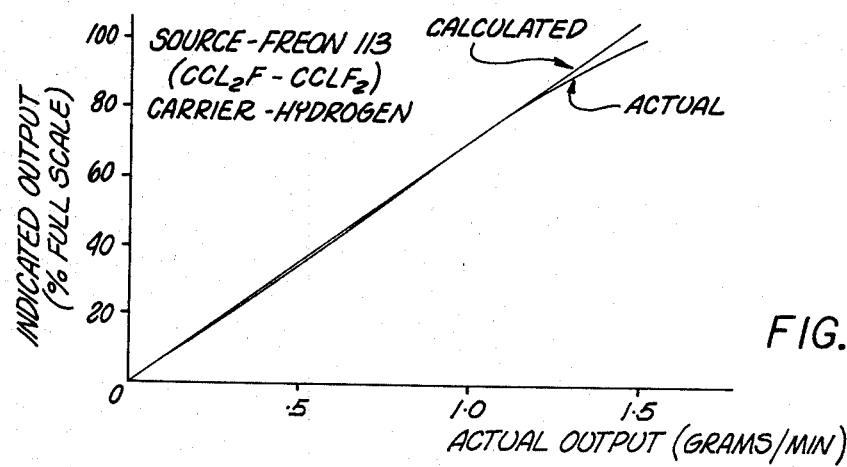

FIGS. 3-5 are plots of test results obtained using various gases as the carrier gas and trichlorotrifluoroethane (C$_2$Cl$_2$F$_3$) as the source liquid. Calculated results are shown by dashed lines and actual results shown by solid lines. It can be seen that the results are in excellent agreement with that predicted by the above equation.

While the foregoing description has been concerned with a particular control system, various modifications as previously outlined, can be made. For example, by eliminating the control throttle valve 22, comparator controller 18 and command signal over the line 76, the device serves as a flowmeter to measure the mass flow rate of the vaporized source liquid.

We claim:

1. A calibratable control system for accurately metering the amount of a predetermined liquid vaporized by a carrier gas passing therethrough independent of temperature and pressure changes, comprising:

a mixing station for forming a mixture of said carrier gas and vaporized liquid;

a flow controller comprising an inlet for said carrier gas, and an outlet, a first mass flow sensor connected between said flow controller inlet and outlet generating a first signal in correspondence to the mass flow rate of said carrier gas therethrough, and an adjustable valve controlling flow through said outlet to deliver carrier gas to said mixing station;

a flowmeter comprising an inlet for receiving said mixture from said mixing station, and an outlet therefor, and a second flow sensor connected between said flowmeter inlet and outlet generating a second signal in correspondence to the mass flow rate of said mixture therethrough;

each of said mass flow sensors comprising a sampling tube and, wound on said tube, heating and temperature sensing wires providing an output voltage as a function of mass flow independent of ambient temperature and pressure changes;

means for comparing said first and second signals to yield a third signal representing the mass flow rate of said vaporized liquid;

means for generating a command signal in accordance with a predetermined mass flow rate of said vaporized liquid;

means for comparing said command signal to said third signal;

means for adjusting said flow controller valve in accordance with any difference between the command signal and said third signal whereby to minimize or eliminate said difference;

means for diverting carrier gas from the outlet of said flow controller to the inlet of said flowmeter, by-passing said mixing station, whereby said first signal corresponds only to the mass flow rate of said carrier gas through said second mass flow sensor; and means for adjusting said first and/or second signal so as to cause said first and second signals to be equalized thereby calibrating said system and whereupon said carrier gas can be redirected to said mixing station.

2. The invention according to claim 1 in which said second signal is adjusted to cause said first and second signals to be equalized.

3. The system of claim 1 in which said heating wires are separate from and spaced from said sensing wires.

4. A method for accurately metering the amount of a predetermined liquid vaporized by a carrier gas passing therethrough independent of temperature and pressure changes, comprising the steps of:

conducting said carrier gas to a mass flow controller and generating a first signal in correspondence to the mass flow of said carrier gas therethrough;

conducting said carrier gas from said mass flow controller through a mass flow-sensor contained therein to a mixing station and forming a mixture of said carrier gas and said vaporized liquid thereat;

conducting said mixture from said mixing station to a mass flowmeter through a mass flow sensor contained therein and generating a second signal in correspondence to the mass flow of said mixture through said mass flowmeter;

each of said mass flow sensors comprising a sampling tube and, wound on said tube, heating and temperature sensing wires providing an output voltage as a function of mass flow independent of ambient temperature and pressure changes;

comparing said first and second signals to yield a third signal representing the mass flow rate of said vaporized liquid;

generating a command signal in accordance with a predetermined mass flow rate of said vaporized liquid;

comparing said command signal to said first signal;

adjusting said flow controller in accordance with any difference between said command signal and said first signal whereby to minimize or eliminate said difference;

diverting carrier gas from said flow controller to said flowmeter, bypassing said mixing station, whereby said first signal corresponds only to the mass flow rate of carrier gas through said flowmeter; and adjusting said first and/or second signal so as to cause said first and second signals to be equalized thereby calibrating said signals and whereupon said carrier gas can be redirected to said mixing station.

5. The method according to claim 4 in which said second signal is adjusted to cause said first and second signals to be equalized.

6. The method of claim 4 in which said heating wires are separate from and spaced from said sensing wires.

* * * * *